United States Patent
Saito et al.

(10) Patent No.: US 8,450,918 B2
(45) Date of Patent: May 28, 2013

(54) LIGHT-EMITTING APPARATUS, DISPLAY APPARATUS, AND LIGHT EMITTER

(75) Inventors: Shinji Saito, Kanagawa (JP); Yasushi Hattori, Kanagawa (JP); Yoshiyuki Harada, Tokyo (JP); Shinya Nunoue, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 219 days.

(21) Appl. No.: 12/874,778

(22) Filed: Sep. 2, 2010

(65) Prior Publication Data
US 2011/0222149 A1    Sep. 15, 2011

(30) Foreign Application Priority Data

Mar. 10, 2010  (JP) .................................. 2010-052781

(51) Int. Cl.
*F21V 9/16* (2006.01)
*G02B 26/00* (2006.01)

(52) U.S. Cl.
USPC .................... 313/483; 250/458.1; 250/461.1; 362/84

(58) Field of Classification Search
USPC ..... 250/458.1, 461.1, 462.1; 313/483; 362/84
See application file for complete search history.

(56) References Cited

U.S. PATENT DOCUMENTS

| | | | |
|---|---|---|---|
| 6,899,435 B2 * | 5/2005 | Yamanaka | 353/94 |
| 2009/0026943 A1 * | 1/2009 | Yuki | 313/505 |
| 2009/0086475 A1 * | 4/2009 | Caruso et al. | 362/231 |
| 2009/0185589 A1 | 7/2009 | Hattori et al. | |
| 2009/0321771 A1 | 12/2009 | Hattori et al. | |
| 2010/0052504 A1 | 3/2010 | Sato et al. | |
| 2010/0148203 A1 | 6/2010 | Hashimoto et al. | |
| 2010/0328617 A1 * | 12/2010 | Masuda | 353/31 |
| 2011/0026260 A1 * | 2/2011 | Ko | 362/285 |
| 2012/0147588 A1 * | 6/2012 | Yang | 362/84 |

FOREIGN PATENT DOCUMENTS

| | | |
|---|---|---|
| JP | 10-269820 | 10/1998 |
| JP | 2000-111909 | 4/2000 |
| JP | 2004-071357 | 3/2004 |
| JP | 2007-26749 | 2/2007 |
| JP | 2008-258171 | 10/2008 |
| JP | 2009-016059 | 1/2009 |
| JP | 2009-86531 A | 4/2009 |
| JP | 2009-224656 | 10/2009 |

OTHER PUBLICATIONS

U.S. Appl. No. 12/876,675, filed Sep. 7, 2010, Hattori, et al.
U.S. Appl. No. 12/876,738, filed Sep. 7, 2010, Hattori, et al.
Office Action issued Jan. 10, 2012, in Japanese Patent Application No. 2010-052781 with English translation.
U.S. Appl. No. 12/729,636, filed Mar. 23, 2010, Yasushi Hattori et al.
Japanese Office Action Issued Aug. 28, 2012 in Patent Application No. 2010-052781 (with English translation).

\* cited by examiner

*Primary Examiner* — Nimeshkumar Patel
*Assistant Examiner* — Steven Horikoshi
(74) *Attorney, Agent, or Firm* — Oblon, Spivak, McClelland, Maier & Neustadt, L.L.P.

(57) ABSTRACT

According to the embodiments, an easy-to-fabricate light-emitting apparatus is provided in which a plurality of phosphors is disposed so as not to overlap each other. The light-emitting apparatus includes a light source that emits excitation light; a substrate having a protrusion and recess configuration where first planes and second planes which intersect the first planes are formed periodically; first phosphor layers formed on the first planes and absorbing the excitation light to emit a first fluorescence; and second phosphor layers formed on the second planes and absorbing the excitation light to emit a second fluorescence with a wavelength different from that of the first fluorescence.

10 Claims, 19 Drawing Sheets

MIDDLE COLOR TEMPERATURE

HIGH COLOR TEMPERATURE

LOW COLOR TEMPERATURE

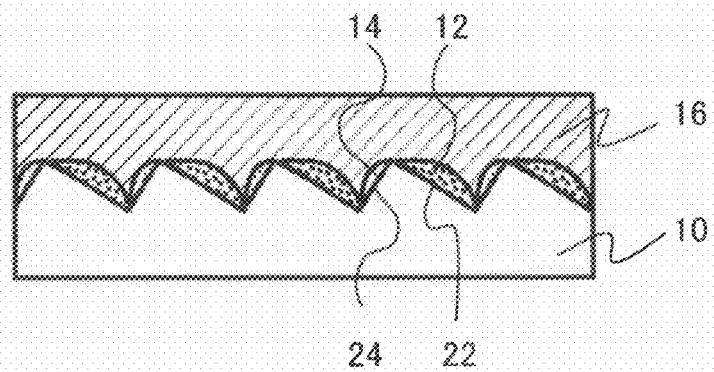

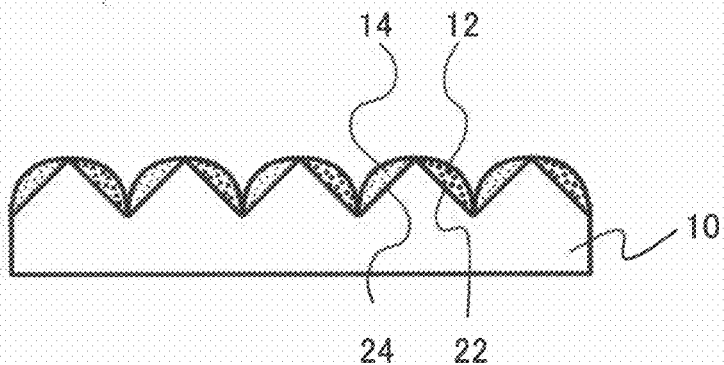
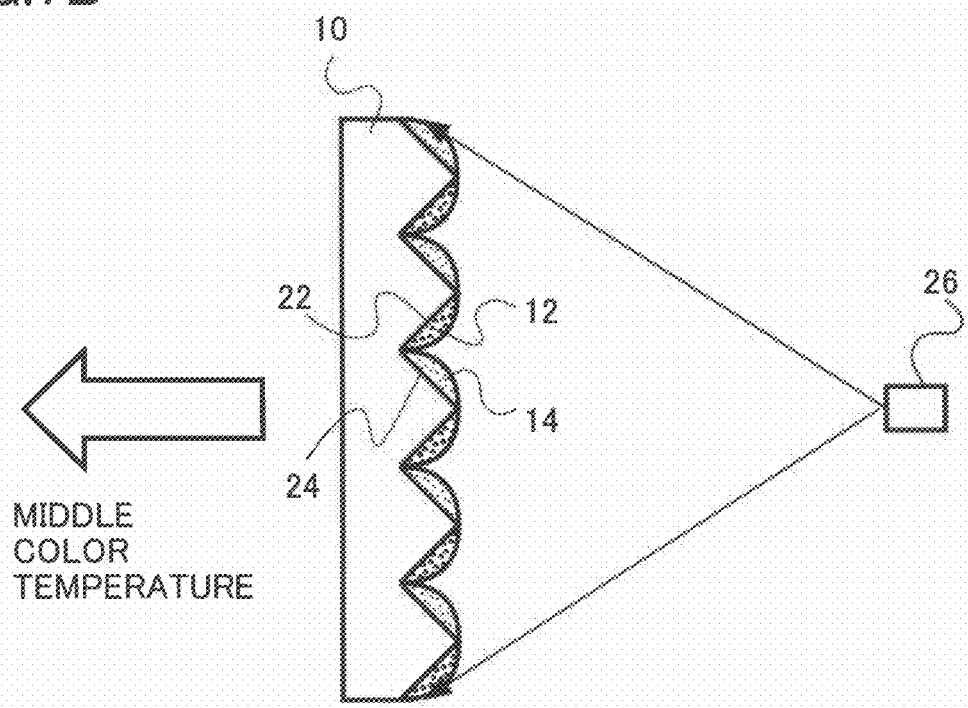

LOW COLOR TEMPERATURE

HIGH COLOR TEMPERATURE

MIDDLE COLOR TEMPERATURE

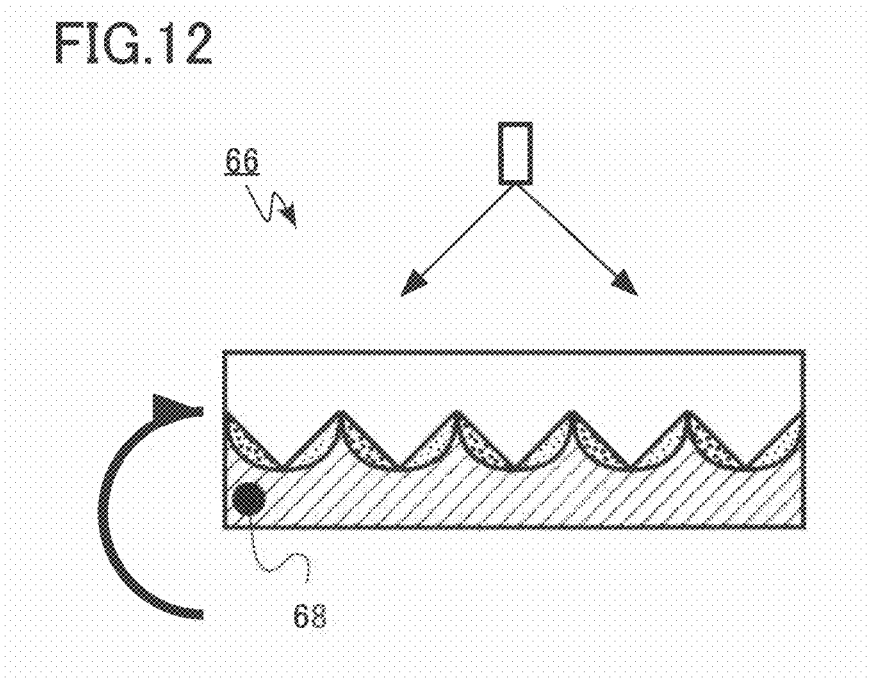

HIGH COLOR TEMPERATURE

LOW COLOR TEMPERATURE

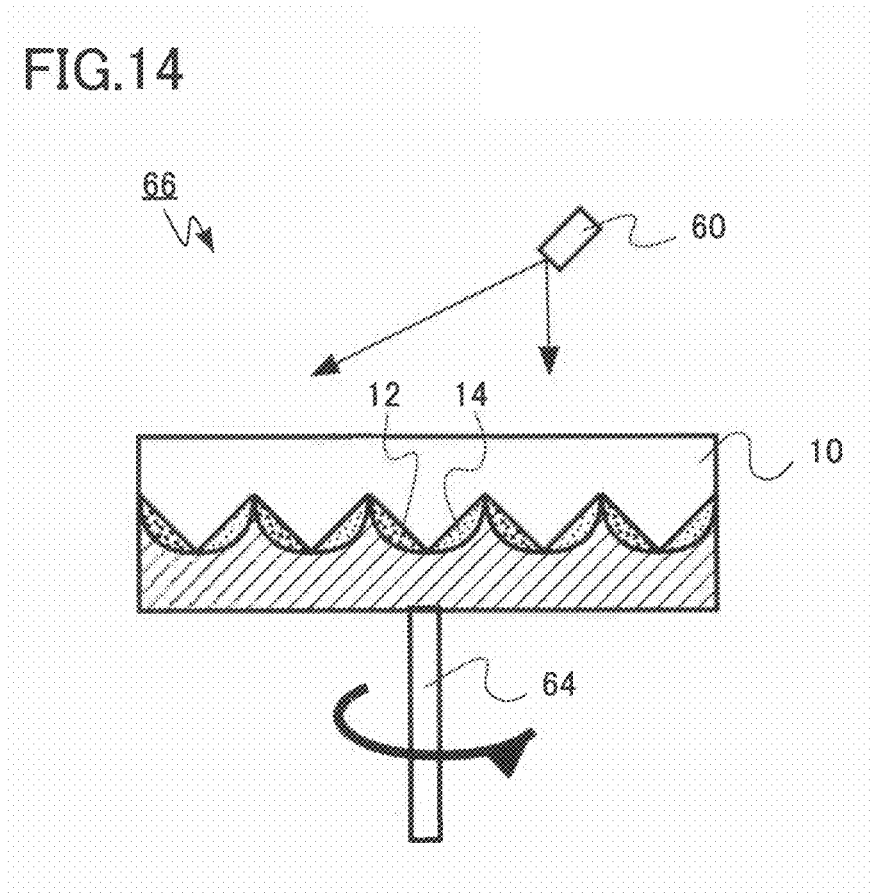

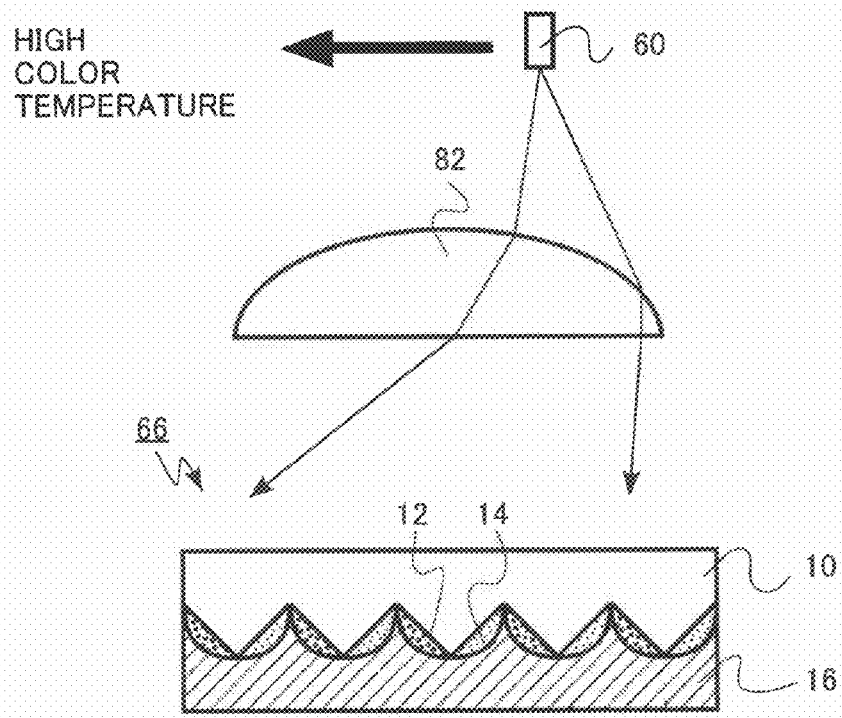
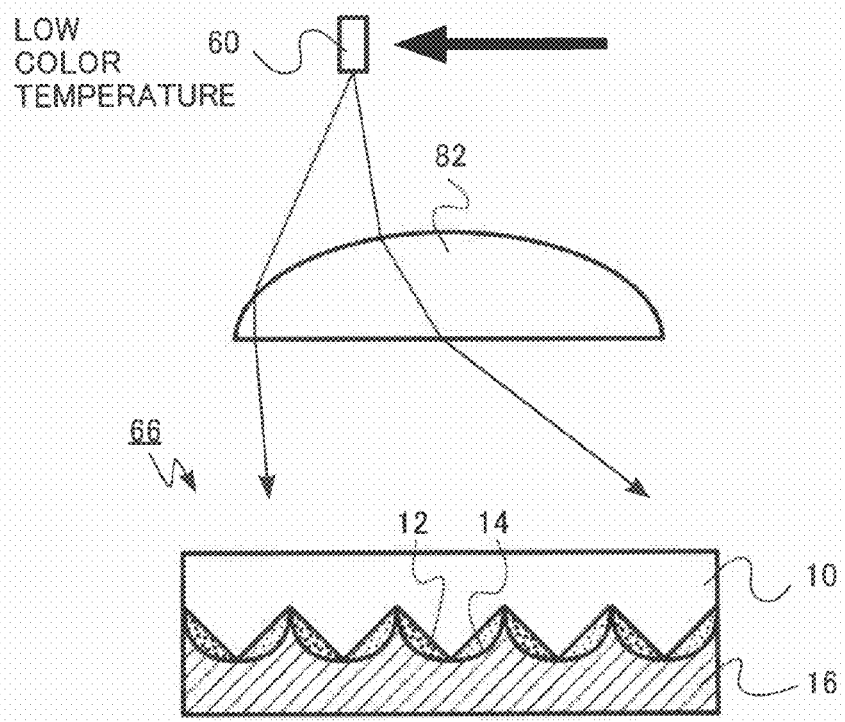

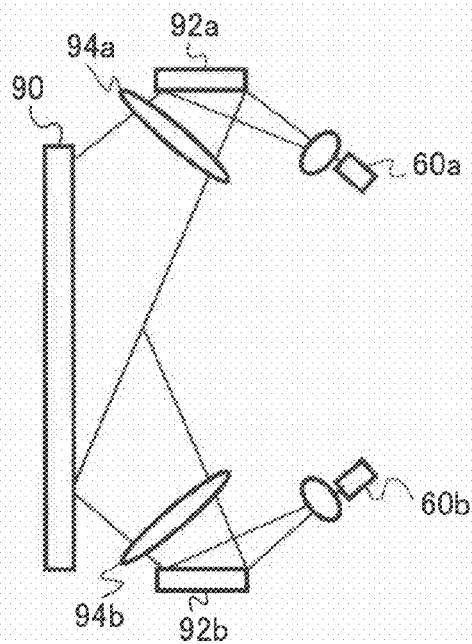
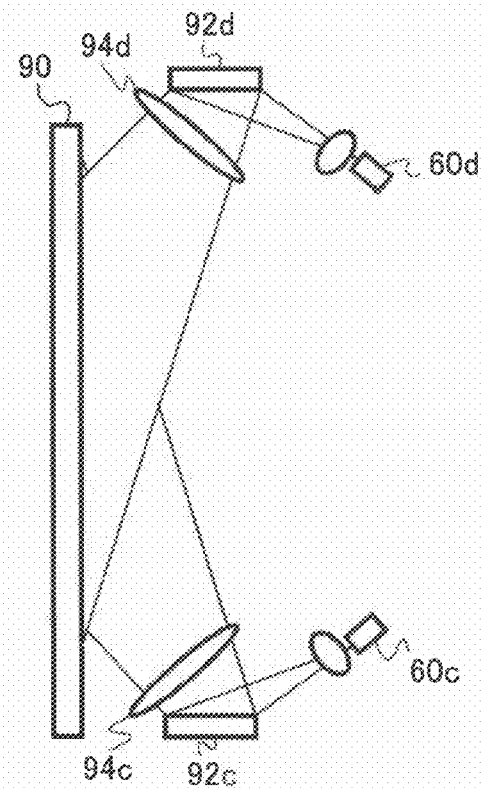

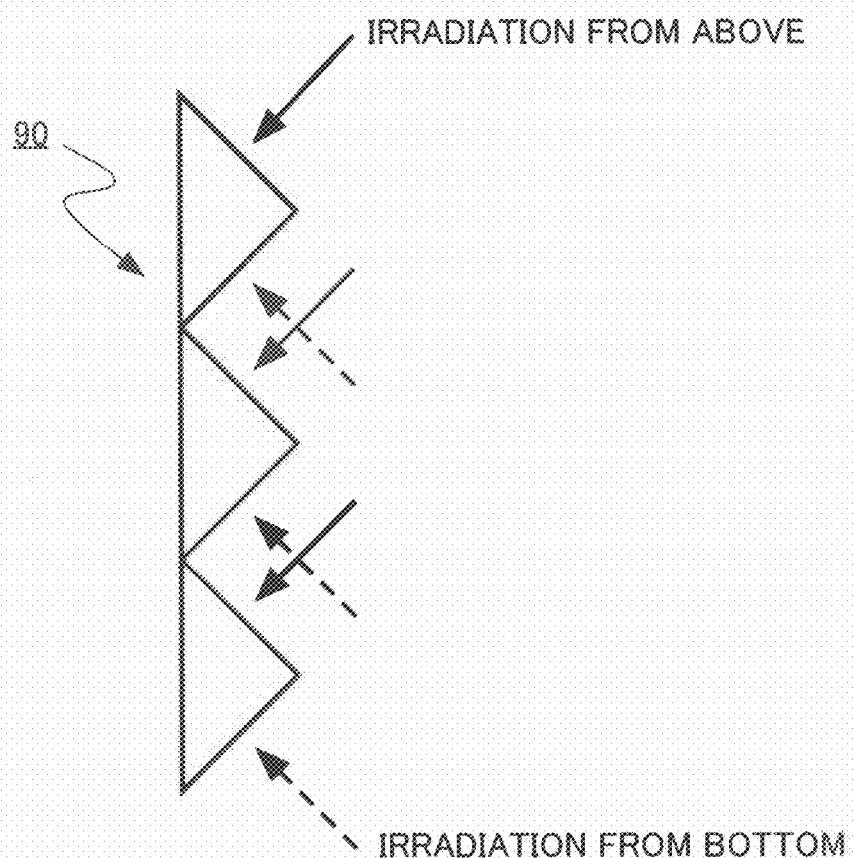

US 8,450,918 B2

LIGHT-EMITTING APPARATUS, DISPLAY APPARATUS, AND LIGHT EMITTER

This application is based upon and claims the benefit of priority from Japanese Patent Application No. 2010-052781, filed on Mar. 10, 2010, the entire contents of which are incorporated herein by reference.

FIELD

Embodiments described herein relate generally to a light-emitting apparatus, a display apparatus, a light emitter, and a method of fabricating a light emitter.

BACKGROUND

Semiconductor light-emitting devices such as LDs (semiconductor laser diodes) and LEDs are widely used in display devices, lighting apparatuses, recording apparatuses, etc. Recently, as a new application of semiconductor light-emitting devices, development of solid-state lighting has been advanced. When semiconductor light-emitting devices are used to replace existing incandescent lamps, there are advantages in that efficiency is high and heat generation is low. Thus, promotion of the replacement is considered to continue.

However, in a white light-emitting apparatus in which a semiconductor light-emitting device and phosphors are combined, a phenomenon of a decrease in light extraction efficiency is exhibited that is caused by occurrence of reabsorption between the phosphors due to the phosphors being not disposed ideally. In addition, a phenomenon is exhibited in which the color of light emission differs depending on the irradiation direction, and thus, the color looks different depending on the irradiation direction.

For example, to avoid reabsorption between phosphors, there is proposed a light-emitting apparatus in which a plurality of phosphors are arranged on a plane so as not to overlap each other in an optical path direction. In addition, for example, there is disclosed a light-emitting apparatus in which by making the distance of a phosphor plate variable with respect to an LED, the irradiation pattern is changed and the color temperature is made variable.

However, forming a plurality of phosphors on a plane such that the phosphors do not overlap each other is difficult in terms of fabrication. In particular, it can be said that fabricating a fine structure is extremely difficult.

BRIEF DESCRIPTION OF THE DRAWINGS

FIG. 6 is a schematic diagram of another variant of the light emitter according to the first embodiment;
FIGS. 7A and 7B are schematic diagrams of still another variant of the light emitter according to the first embodiment;
FIG. 12 is a schematic diagram of a variant of an incident angle variable mechanism according to the second embodiment;
FIG. 14 is a schematic diagram of still another variant of the incident angle variable mechanism according to the second embodiment;
FIGS. 15A and 15B are schematic diagrams of yet another variant of the incident angle variable mechanism according to the second embodiment;
FIGS. 17A and 17B are schematic diagrams of a display apparatus according to a variant of the third embodiment;
FIG. 18 is an illustrative diagram of the actions in the variant of the third embodiment.

DETAILED DESCRIPTION

Figure 1A:
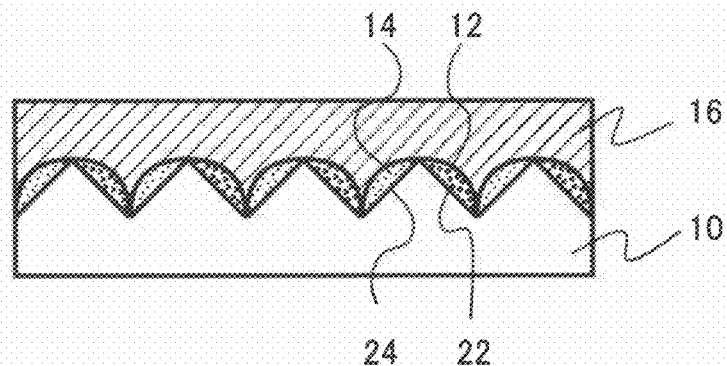
FIGS. 1A and 1B are schematic diagrams of a light emitter according to a first embodiment.

According to the embodiments, an easy-to-fabricate light-emitting apparatus is provided in which a plurality of phosphors is disposed so as not to overlap each other. The light-emitting apparatus includes a light source that emits excitation light; a substrate having a protrusion and recess configuration where first planes and second planes which intersect the first planes are formed periodically; first phosphor layers formed on the first planes and absorbing the excitation light to emit a first fluorescence; and second phosphor layers formed on the second planes and absorbing the excitation light to emit a second fluorescence with a wavelength different from that of the first fluorescence. Embodiments will be described below with reference to the drawings. In description in the following drawings, the same or like parts are denoted by the same or like reference numerals.

First Embodiment

A light emitter according to the present embodiment includes a substrate having a protrusion and recess configuration, the configuration constructed by periodically formed first planes and second planes intersecting the first planes, i.e. the surface of the substrate has first planes and second planes which intersect the first planes are formed periodically; first phosphor layers formed on the first planes; and second phosphor layers formed on the second planes and emitting fluorescence with a wavelength different from that of fluorescence emitted from the first phosphor layers.

Since the light emitter according to the present embodiment has the above-described configuration, the light emitter can easily achieve disposition where a plurality of phosphors do not overlap each other or the degree of overlapping is small. In addition, by using the light emitter according to the present embodiment, a light-emitting apparatus with variable color temperature and excellent luminous efficiency can be implemented.

Figure 1B:
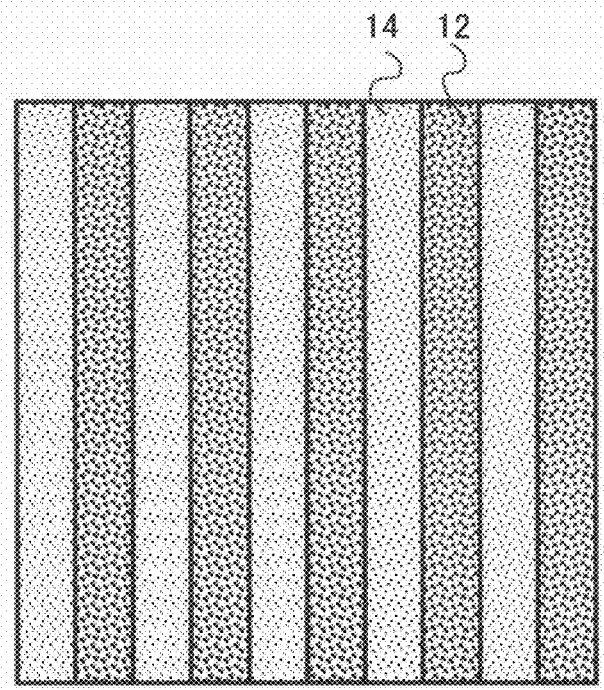

FIGS. 1A and 1B are schematic diagrams of a light emitter according to the present embodiment. FIG. 1A is a cross-sectional view and FIG. 1B is a plan view.

The light emitter in FIGS. 1A and 1B includes a substrate 10 formed of, for example, a transparent glass; first phosphor layers 12 formed on one surface of the substrate 10; and second phosphor layers 14 that emit fluorescence with a wavelength different from that of fluorescence emitted from the first phosphor layers 12. In addition, a metal layer 16 is formed on top surfaces of the first phosphor layers and the second phosphor layers. Note that FIG. 1B is a plan view showing a phosphor layer pattern as viewed from the side of the transparent substrate 10.

First planes 22 and second planes 24 which intersect the first planes 22 in an inclined manner are periodically formed on the surface of the substrate 10. Therefore, one of the surfaces of the substrate 10 has a protrusion and recess configuration where the first planes 22 and the second planes 24 are alternately repeated.

The first phosphor layers 12 are formed on the first planes 22, and the second phosphor layers 14 are formed on the second planes 24. The first phosphor layers 12 are, for example, blue phosphor layers that emit blue light using ultraviolet light as excitation light. The second phosphor layers 14 are, for example, yellow phosphor layers that emit yellow light with a longer wavelength than blue light, using ultraviolet light as excitation light.

The metal layer 16 is, for example, a film using silver (Ag) as a material. The metal layer 16 functions as a heat sink for the light emitter. The metal layer 16 also functions as a reflector for excitation light that enters the phosphor layers, and fluorescence emitted from the phosphor layers.

In the light emitter according to the present embodiment, the first phosphor layers 12 and the second phosphor layers 14 are formed such that they do not overlap each other or the degree of overlapping is minimized. Therefore, when the light emitter is used in a light-emitting apparatus having a light source such as an ultraviolet laser, fluorescence reabsorption by the first phosphor layers 12 and the second phosphor layers 14 can be suppressed to a minimum. Accordingly, a light-emitting apparatus with high luminous efficiency can be implemented.

Furthermore, use of the light emitter according to the present embodiment enables to easily change the color temperature by changing the relative position of an outgoing direction of excitation light emitted from the light source and the substrate 10. Therefore, by using the light emitter according to the present embodiment in a light-emitting apparatus, a light-emitting apparatus that can easily change the color temperature can be implemented.

Figure 2A:
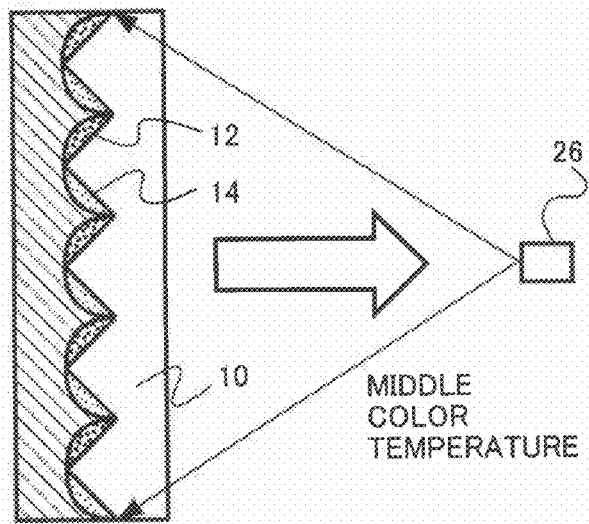
FIGS. 2A to 2C are diagrams describing the actions of the light emitter according to the first embodiment.
Figure 2B:
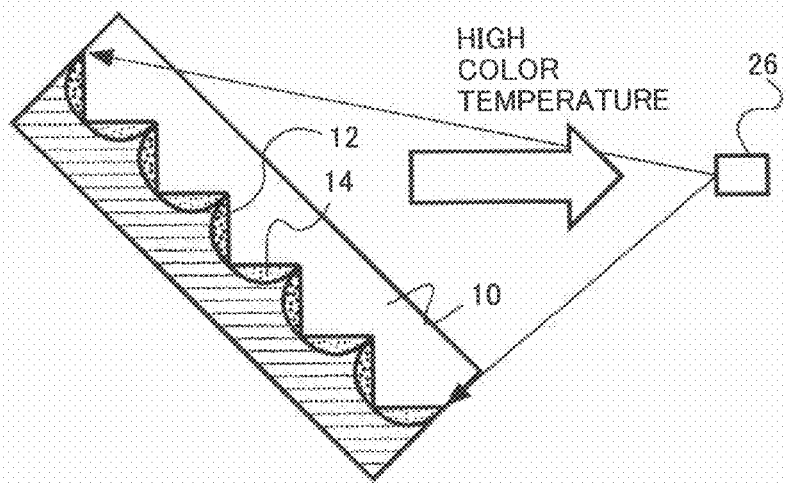
Figure 2C:
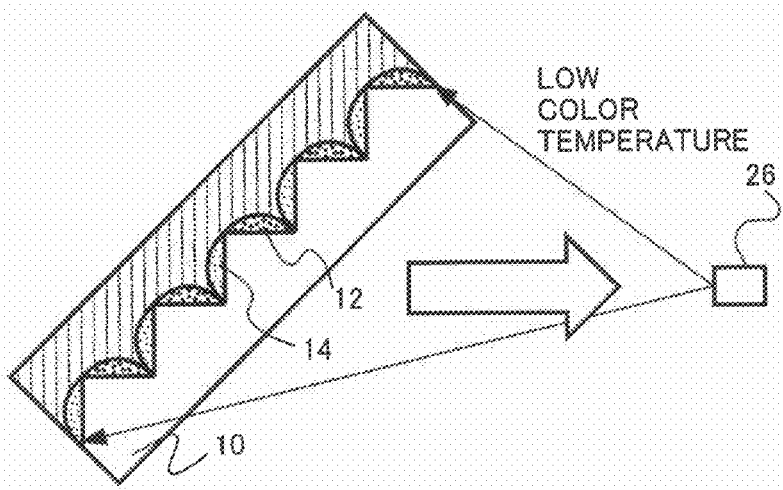

FIGS. 2A to 2C are diagrams describing the actions of the light emitter according to the present embodiment. The light emitter is a reflective-type light emitter configured such that excitation light enters the transparent glass side and first and second fluorescences are extracted from the transparent glass side.

Here, for example, a semiconductor laser diode (LD) 26 that emits ultraviolet light serving as excitation light and the substrate 10 are placed in a positional relationship shown in FIG. 2A. In this case, by letting excitation light enter the first phosphor layers 12 and the second phosphor layers 14 uniformly, daylight fluorescence with a middle color temperature is emitted in an incident direction of the excitation light.

On the other hand, as shown in FIG. 2B, the semiconductor laser diode 26 and the substrate 10 are relatively inclined from the positional relationship shown in FIG. 2A. In this case, more excitation light enters the first phosphor layers 12 which are blue phosphors. Thus, fluorescence with a higher color temperature than that in the case of FIG. 2A is emitted in an incident direction of the excitation light.

As shown in FIG. 2C, the semiconductor laser diode 26 and the substrate 10 are relatively inclined from the positional relationship shown in FIG. 2A in an opposite direction to that in the case of FIG. 2B. In this case, more excitation light enters the second phosphor layers 14 which are yellow phosphors. Thus, warm-white fluorescence with a lower color temperature than that in the case of FIG. 2A is emitted in an incident direction of the excitation light.

Figure 3A:
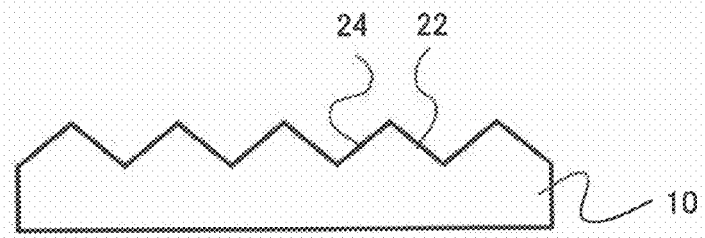
FIGS. 3A to 3C are diagrams showing a first fabrication method according to the first embodiment.
Figure 3B:
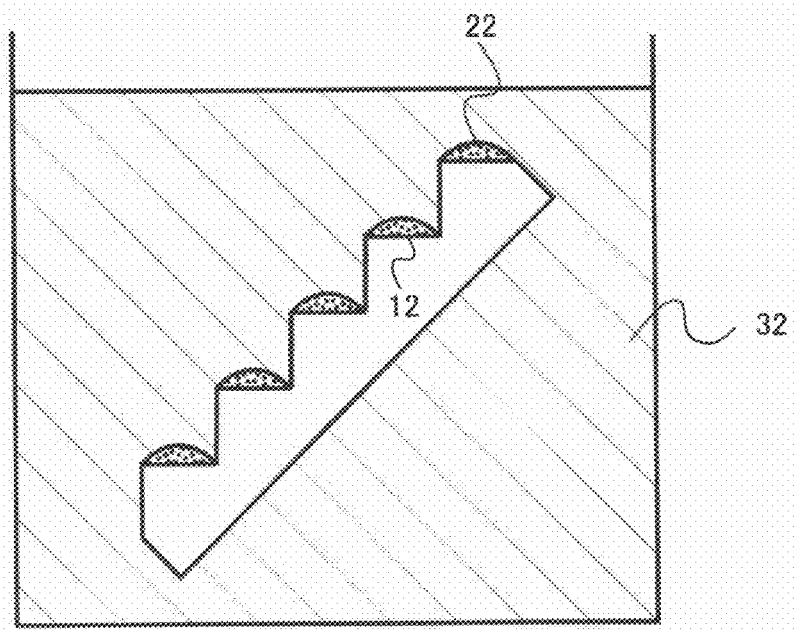
Figure 3C:
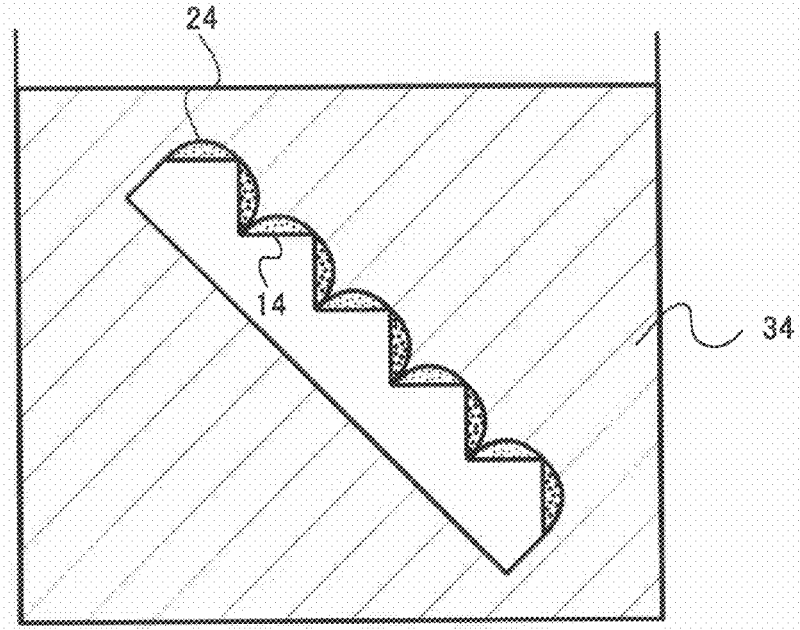

FIGS. 3A to 3C are diagrams showing a first fabrication method according to the present embodiment. In this method, phosphor layers are formed by a sedimentation method. First, as shown in FIG. 3A, a substrate 10 is prepared that has a protrusion and recess configuration where first planes 22 and second planes 24 which intersect the first planes 22 with inclination are formed periodically. The substrate 10 is, for example, a transparent glass substrate.

Then, a first solution 32 is prepared in which, for example, blue phosphor particles are dispersed in water which is a solvent. In addition, a second solution 34 is prepared in which yellow phosphor particles are dispersed in water which is a solvent.

Then, as shown in FIG. 3B, the substrate 10 is immersed in the first solution 32 such that the first planes 22 face the liquid level side of the first solution 32. Specifically, the substrate 10 is immersed such that the first planes 12 are substantially parallel to the liquid level. For example, the substrate 10 is left in this state for about one hour. By immersing the substrate 10 in such a direction, the blue phosphor particles dispersed in the solution settle in the direction of gravity and thus are selectively deposited on the first planes 22. Thereafter, the substrate 10 is taken out of the first solution 32 and dried, for example, at 120° C. for about three hours or more.

Then, as shown in FIG. 3C, the substrate 10 is immersed in the second solution 34 such that the second planes 24 face the liquid level side of the second solution 34. For example, the substrate 10 is left in this state for about one hour. By immersing the substrate 10 in such a direction, the yellow phosphor particles dispersed in the solution are selectively deposited on the second planes 24. Thereafter, the substrate 10 is taken out of the second solution 34 and dried, for example, at 120° C. for about three hours or more.

Then, a metal layer of, for example, silver is formed to cover first phosphor layers 12 and second phosphor layers 14. The silver metal layer can be formed by, for example, vacuum deposition or electroless plating.

In this manner, the light emitter shown in FIGS. 1A and 1B can be formed by an extremely easy process. In this method, even if the widths or areas of the first and second planes are very small, in principle, phosphor layers can be selectively formed on the respective planes.

In the above-described fabrication method, it is desirable to form a protective layer for the top surfaces of the first phosphor layers 12 and the second phosphor layers 14. The protective layer is, for example, a silicon dioxide water glass. When the first and second solutions are prepared, by adding, for example, $Ba(NO_3)_2$ and $Na_2SiO_3$, a protective layer which is a silicon dioxide water glass can be formed. In particular, formation of the protective layer is effective in terms of protecting the first phosphor layers 12 and the second phosphor layers 14 when a metal layer is formed on the first and second phosphor layers 12 and 14.

After the formation of a metal layer, the process of applying pressure to the metal layer to flatten a surface of the metal layer on the opposite side of the substrate may be provided.

By thus flattening one surface of the metal layer, there are advantages in that implementation of the light emitter is facilitated, and that, when a heat sink is provided below the light emitter, the adhesion between the heat sink and the metal layer improves and thus heat dissipation characteristics improve.

Figure 4A:
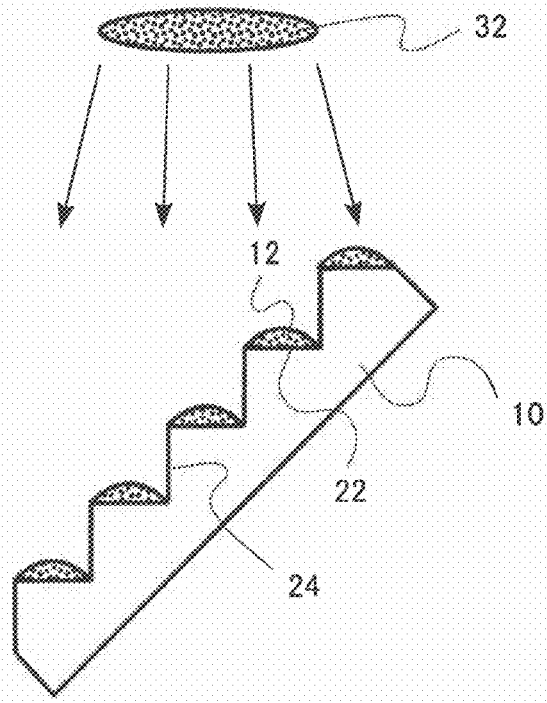
FIGS. 4A and 4B are diagrams showing a second fabrication method according to the first embodiment.
Figure 4B:
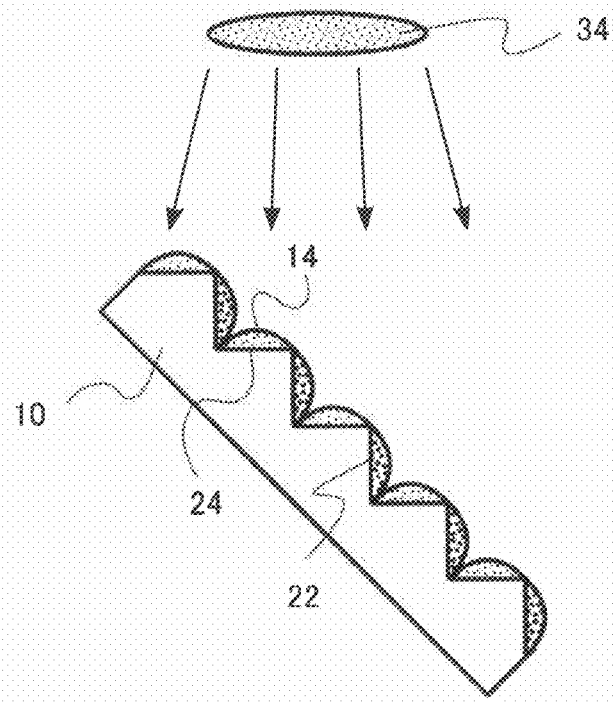

FIGS. 4A and 4B are diagrams showing a second fabrication method according to the present embodiment. This is a fabrication method for forming phosphor layers by a vacuum deposition method. First, a substrate 10 is prepared that has a protrusion and recess configuration where first planes 22 and second planes 24 which intersect the first planes 22 are formed periodically. The substrate 10 is, for example, a transparent glass substrate.

Then, as shown in FIG. 4A, a first deposition source 32 for forming first phosphor layers is prepared and disposed in a vacuum depositor (not shown). Then, the substrate 10 is introduced into the vacuum depositor and deposition is performed.

At this time, the substrate 10 is placed such that the first planes 22 are substantially parallel to the first deposition source 32. By thus placing the substrate 10, the second planes 24 are shadowed against the first deposition source 32 upon deposition, and accordingly, first phosphor layers 12 are formed only on the first planes 22. After this, the substrate 10 is taken out of the vacuum depositor.

Then, as shown in FIG. 4B, a second deposition source 34 for forming second phosphor layers is prepared and disposed in a vacuum depositor (not shown). Then, the substrate 10 is introduced into the vacuum depositor and deposition is performed.

At this time, the substrate 10 is placed such that the second planes 24 are substantially parallel to the second deposition source 34. By thus placing the substrate 10, the first planes 22 are shadowed against the second deposition source 34 upon deposition, and accordingly, second phosphor layers 14 are formed only on the second planes 24. After this, the substrate 10 is taken out of the vacuum depositor.

Subsequent formation of a metal layer on the first phosphor layers 12 and the second phosphor layers 14 is the same as that in the first fabrication method. In the above-described manner, the light emitter shown in FIGS. 1A and 1B can be fabricated.

Although in the second fabrication method phosphor layers are formed by a vacuum deposition method, phosphor layers can also be formed by a sputtering method as a third fabrication method. In this case, a first target for forming first phosphor layers and a second target for forming second phosphor layers are prepared.

Then, as in the case of a vacuum deposition method, a substrate is placed in a sputtering apparatus such that first planes are substantially parallel to the first target, and sputtering is performed, whereby first phosphor layers are formed. Also, the substrate is placed in the sputtering apparatus such that second planes are substantially parallel to the second target, and sputtering is performed, whereby second phosphor layers are formed.

Thereafter, in the same manner as that in the first or second fabrication method, the light emitter shown in FIGS. 1A and 1B can be fabricated.

As such, by the provision of a protrusion and recess configuration formed by first and second planes, on a substrate, a light emitter according to the present embodiment can be fabricated extremely easily, using fabrication methods such as those described above.

Figure 5A:
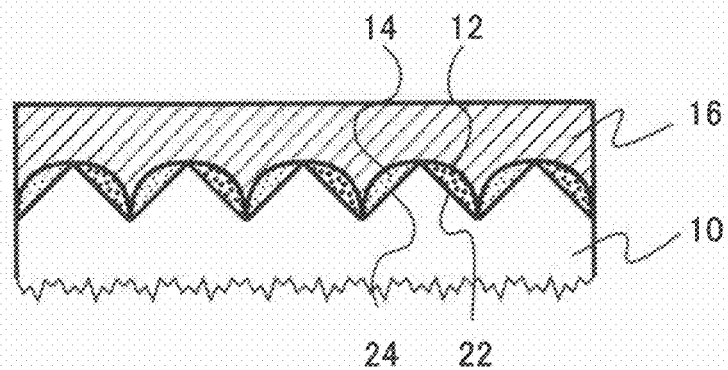
FIGS. 5A and 5B are schematic diagrams of variants of the light emitter according to the first embodiment.
Figure 5B:
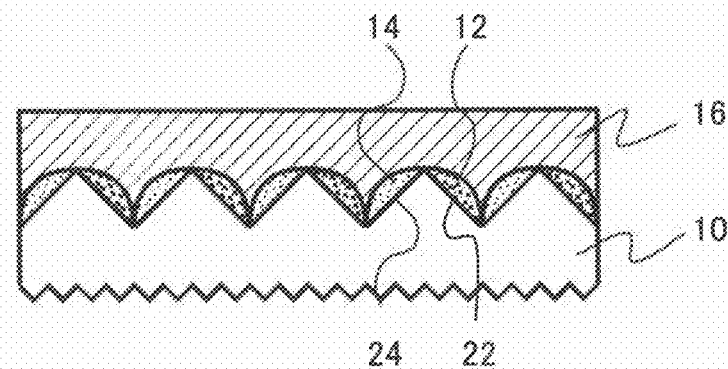

FIGS. 5A and 5B are schematic diagrams of variants of the light emitter according to the present embodiment. FIGS. 5A and 5B both show light emitters having protrusions and recesses on a surface of a transparent glass substrate 10 on the opposite side of the side where phosphor layers are formed.

By thus providing protrusions and recesses, reflection due to the refractive index between glass and air can be reduced and thus a light emitter with excellent luminous efficiency can be implemented. In addition, even when the substrate is inclined with respect to excitation light, influence of reflection can be reduced.

Fluorescences emitted from the respective phosphor layers can be prevented from being seen separately. To prevent fluorescences emitted from the respective phosphor layers from being seen separately, the period of the protrusions and recesses needs to be smaller than the period of the protrusions and recesses provided on the surface where the phosphor layers are provided.

FIG. 5A shows the case of random protrusions and recesses, and FIG. 5B shows the case of periodic protrusions and recesses. In particular, in the case of FIG. 5B, the period of the protrusions and recesses is desirably 300 μm or less, in terms of preventing fluorescences from being seen separately.

FIG. 6 is a schematic diagram of another variant of the light emitter according to the present embodiment. This light emitter is configured such that when the luminous efficiency of first phosphor layers is higher than that of second phosphor layers, the total area of first planes is made smaller than that of second planes, and when the luminous efficiency of the first phosphor layers is lower than that of the second phosphor layers, the total area of the first planes is made larger than that of the second planes.

Specifically, the areas of first planes 22 and second planes 24 are formed in accordance with the luminous efficiencies of first phosphor layers 12 and second phosphor layers 14. FIG. 6 shows the case in which, for example, the luminous efficiency of the first phosphor layers 12 is lower than that of the second phosphor layers 14 and the amounts of light emitted therefrom, respectively, need to be uniform. When the amounts of light emitted or color tones are made uniform, an adjustment can be made with the film thicknesses of the respective phosphor layers but as in the present variant, an adjustment can also be made with the configuration of a substrate 10.

FIGS. 7A and 7B are schematic diagrams of still another variant of the light emitter according to the present embodiment. As shown in FIG. 7A, a light emitter according to the present variant differs from the light emitter shown in FIGS. 1A and 1B in that a metal layer is not provided above phosphor layers.

While FIGS. 1A and 1B show a reflective-type light emitter, the light emitter according to the present variant is a transmissive-type light emitter. As shown in FIG. 7B, for example, excitation light from a semiconductor laser diode 26 enters the phosphor layer side of a transparent glass substrate 10 and fluorescence is extracted from the opposite side of the substrate 10.

In the case of the drawing, since excitation light is uniformly irradiated onto first phosphor layers 12 and second phosphor layers 14, fluorescence with a middle color temperature is obtained. In the present variant, too, as described in FIGS. 2A to 2C, by relatively inclining the semiconductor laser diode 26 and the substrate 10 from a positional relationship shown in FIG. 7B, the color temperature can be changed.

Figure 8A:
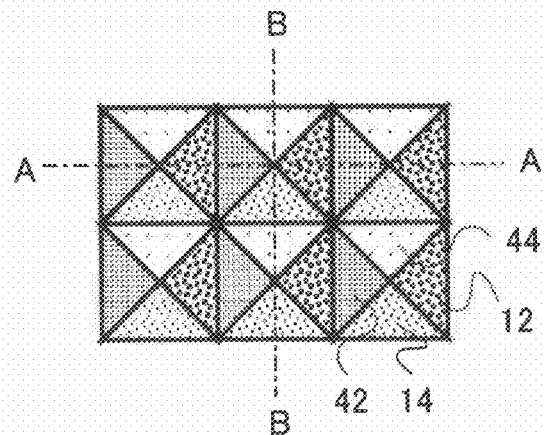
FIGS. 8A to 8C are schematic diagrams of yet another variant of the light emitter according to the first embodiment.
Figure 8B:
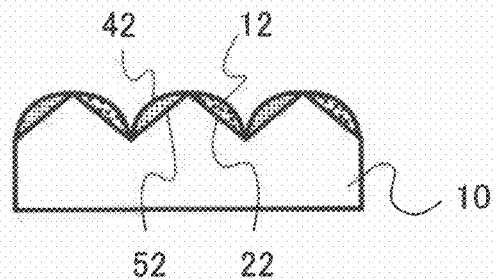
Figure 8C:
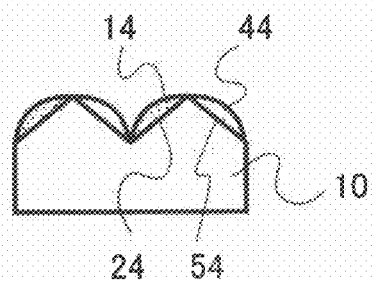
Figure 9A:
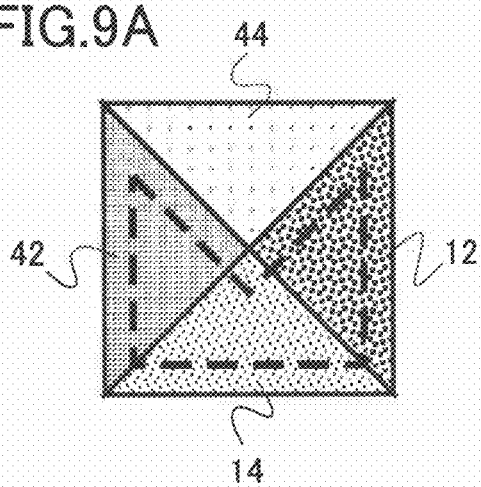
FIGS. 9A to 9E are diagrams describing the actions of the light emitter in FIGS. 8A to 8C.
Figure 9D:
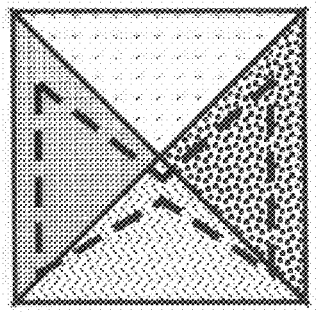
Figure 9B:
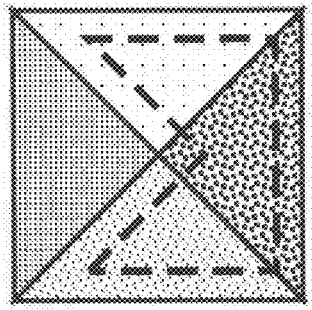
Figure 9E:
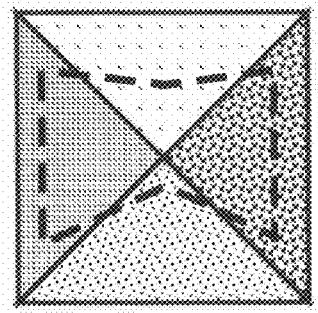
Figure 9C:
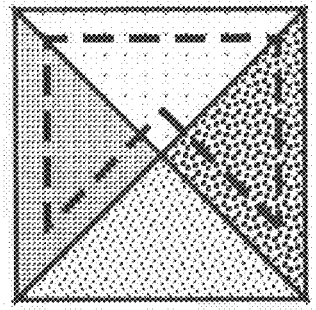

FIGS. 8A to 8C are schematic diagrams of yet another variant of the light emitter according to the present embodiment. FIG. 8A is a top view, FIG. 8B is an A-A cross-sectional view of FIG. 8A, and FIG. 8C is a B-B cross-sectional view of FIG. 8A.

In the present variant, in addition to first planes 22 and second planes 24, third planes 52 and fourth planes 54 are provided. The first, second, third, and fourth planes form a square pyramid. Furthermore, first phosphor layers 12, second phosphor layers 14, third phosphor layers 42, and fourth phosphor layers 44 are formed on the first, second, third, and fourth planes, respectively.

Here, for example, the first phosphor layers 12 are blue phosphor layers, the second phosphor layers 14 are yellow phosphor layers, the third phosphor layers 42 are green phosphor layers, and the fourth phosphor layers 44 are red phosphor layers.

FIGS. 9A to 9E are diagrams describing the actions in the present variant. A region surrounded by a dashed line indicates a region where a laser beam serving as excitation light is irradiated. By thus limiting the laser beam irradiation region and variously changing the irradiation pattern, as shown in FIGS. 9A to 9E, lights with a variety of color temperatures can be emitted.

Note that the light emitter according to the present variant can be easily fabricated by sequentially repeating any of the first to third fabrication methods applied to the first and second planes, for the third and fourth planes.

In the light emitter according to the present embodiment and the variants thereof, it is desirable that the angle formed by different planes be 90 degrees or less. This is because selective formation of a phosphor layer on a specific plane is facilitated upon fabrication.

Second Embodiment

A light-emitting apparatus according to the present embodiment includes a light source that emits excitation light; a substrate having a protrusion and recess configuration, the configuration constructed by periodically formed first planes and second planes intersecting the first planes; first phosphor layers formed on the first planes and absorbing the excitation light to emit a first fluorescence; and second phosphor layers formed on the second planes and absorbing the excitation light to emit a second fluorescence with a wavelength different from that of the first fluorescence. Namely, the light-emitting apparatus includes a light source; and a light emitter described in the first embodiment.

By the light-emitting apparatus according to the present embodiment having the above-described configuration, fluorescence reabsorption between different phosphor layers is suppressed, enabling to achieve high luminous efficiency. Such a light-emitting apparatus can be fabricated easily.

The light-emitting apparatus according to the present embodiment further includes an incident angle variable mechanism for relatively moving an outgoing direction of the excitation light and the substrate, to make the incident angles of the excitation light on the first and second planes variable. By having this configuration, lights with different color temperatures can be emitted.

Figure 10A:
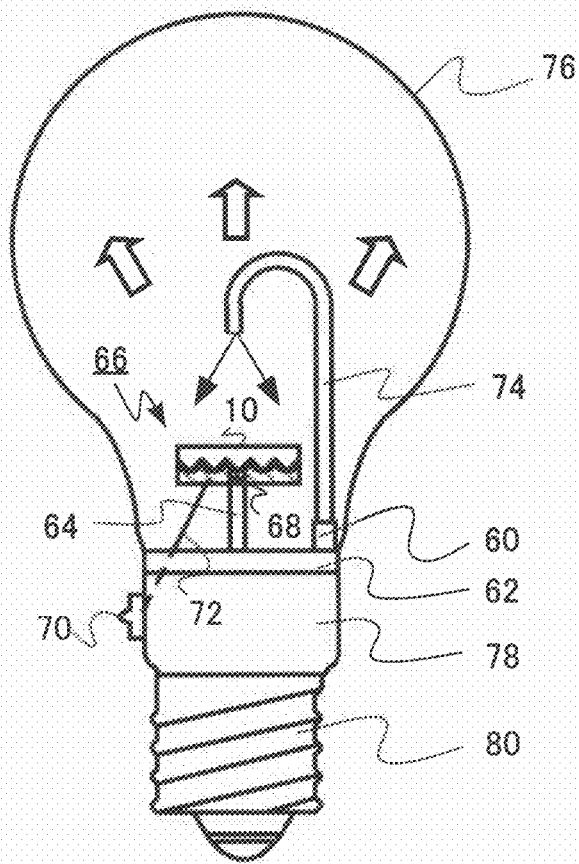
FIGS. 10A and 10B are schematic diagrams of a light-emitting apparatus according to a second embodiment.
Figure 10B:
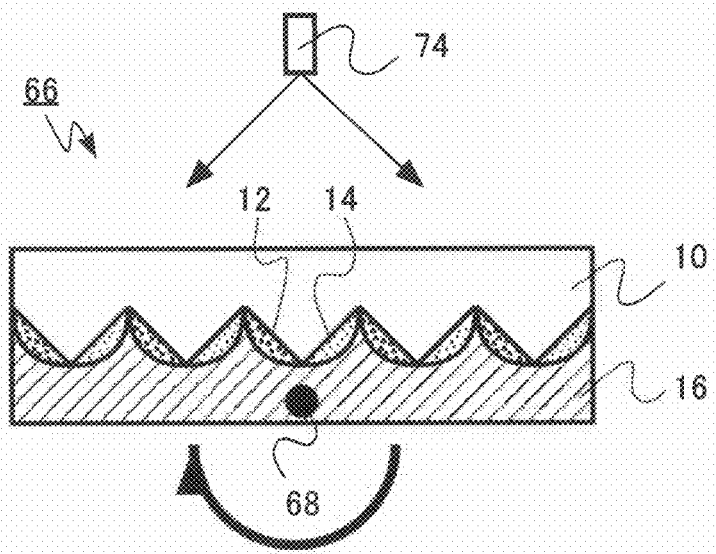

FIGS. 10A and 10B are schematic diagrams of a light-emitting apparatus according to the present embodiment. FIG. 10A is an overall view and FIG. 10B is an enlarged view of a light emitter portion. The light-emitting apparatus is an LD lamp used for replacement of an incandescent lamp.

The light-emitting apparatus according to the present embodiment includes, for example, an AlGaInN-based semiconductor laser diode 60 that emits laser light serving as excitation light. The semiconductor laser diode 60 is provided on a top surface of a substrate 62 which also serves as a heat dissipating portion, so as to be in contact with the substrate 62. The substrate 62 is formed of a metal, e.g., aluminum.

In addition, a column 64 is provided on the substrate 62. A light emitter 66 described in FIGS. 1A and 1B is supported by the column 64. The light emitter 66 is inclinably supported with a fulcrum 68 as a pivot. The inclination angle of the light emitter 66 is controlled by a connection rod 72 moving the light emitter 66 in response to up and down movement of a switch 70.

An optical fiber 74 is attached to the semiconductor laser diode 60. Laser light enters phosphor layers from the side of a substrate 10, a transparent glass, of the light emitter 66, through the optical fiber 74.

A globe 76 of a transparent glass or plastic is attached to the substrate 62 to cover the semiconductor laser diode 60 and the light emitter 66. The globe 76 has a spherical shape and has the function of protecting the semiconductor laser diode 60 and the light emitter 66 inside the globe 76. For example, to prevent the semiconductor laser diode 60 and the light emitter 66 from deteriorating as a result of air contact, the inside of the globe 76 may be evacuated or may be filled with argon gas, etc.

On a side of the substrate 62 opposite to the side with the globe 76, an insulating member 78 made of, for example, a synthetic resin is attached. A base 80 is formed on the side of the substrate 62 with the insulating member 78 therebetween. Note that the substrate 62 is provided with, for example, a control circuit for the semiconductor laser diode 60. The base 80 and the control circuit are electrically connected to each other by, for example, a wiring line provided in the insulating member 78.

In the present embodiment, an inclination angle changing mechanism of the light emitter 66 using the column 64, the fulcrum 68, the switch 70, and the connection rod 72 is an incident angle variable mechanism for relatively moving the outgoing direction of excitation light and the substrate 10 of the light emitter 66. By the incident angle variable mechanism, the incident angles of excitation light on the first and second planes are made variable.

Note that for the semiconductor laser diode 60 it is desirable to use one having a blue to ultraviolet emission peak wavelength in a wavelength range of 430 nm or less, in terms of efficient production of white light.

Figure 11C:
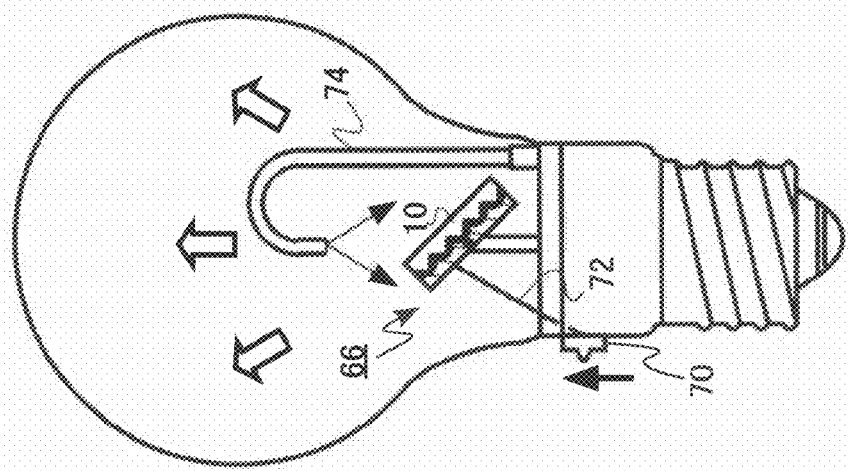
FIGS. 11A to 11C are diagrams describing the actions of the light-emitting apparatus according to the second embodiment.
Figure 11B:
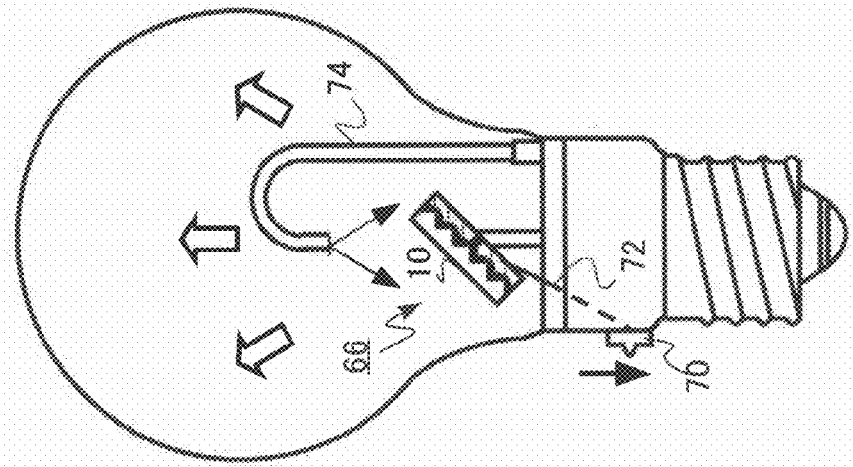
Figure 11A:
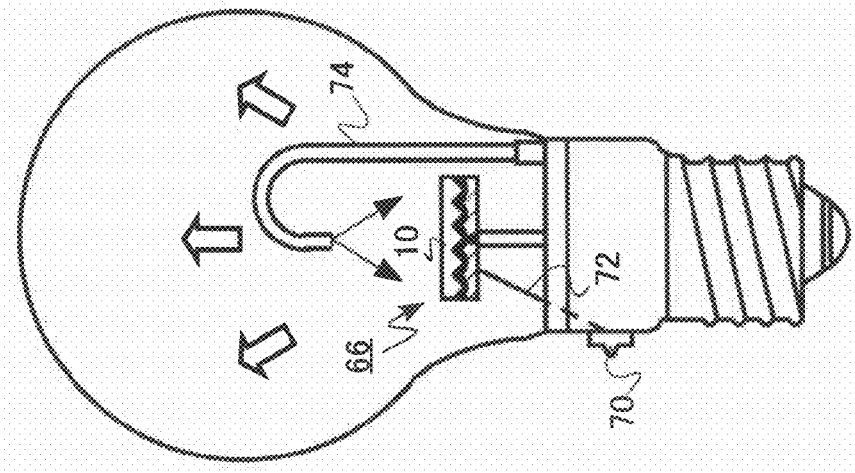

FIGS. 11A to 11C are diagrams describing the actions of the light-emitting apparatus according to the present embodiment. For example, an outgoing direction of a laser beam from the optical fiber 74 and the substrate 10 of the light emitter 66 are placed in a positional relationship shown in FIG. 11A. In this case, by excitation light entering the first phosphor layers 12 and the second phosphor layers 14 uniformly, daylight fluorescence with a middle color temperature is emitted in an incident direction of the excitation light.

On the other hand, as shown in FIG. 11B, when the switch 70 is pressed down, the light emitter 66 is pulled by the connection rod 72. In this manner, the outgoing direction of a laser beam from the optical fiber 74 and the substrate 10 of the light emitter 66 are relatively inclined from the positional relationship shown in FIG. 11A. In this case, for example, more excitation light enters the first phosphor layers which are blue phosphors. Thus, fluorescence with a higher color temperature than that in the case of FIG. 11A is emitted in the incident direction of the excitation light.

As shown in FIG. 11C, by pressing up the switch 70, the light emitter 66 is pressed by the connection rod 72. In this manner, the outgoing direction of a laser beam from the optical fiber 74 and the substrate 10 of the light emitter 66 are relatively inclined from the positional relationship shown in FIG. 11A in an opposite direction to that in the case of FIG. 11B. In this case, for example, more excitation light enters the second phosphor layers which are yellow phosphors. Thus, warm-white fluorescence with a lower color temperature than that in the case of FIG. 11A is emitted in the incident direction of the excitation light.

As such, according to the light-emitting apparatus of the present embodiment, the color temperature can be changed in a predetermined range.

In the present embodiment, the case of using a semiconductor laser diode as a light source is described as an example. In terms of obtaining high luminance, it is desirable to use a semiconductor laser diode as a light source but other light sources, e.g., an LED, can also be used.

When a laser is used as excitation light, in terms of reducing, for example, deterioration of phosphor layers due to heat generation caused by high energy, it is desirable to use a reflective-type light emitter according to the present embodiment. However, a transmissive-type light emitter can also be used.

FIG. 12 is a schematic diagram of a variant of the incident angle variable mechanism. Unlike FIG. 10B, a fulcrum 68 is provided at an edge instead of at the center of a light emitter 66.

Figure 13A:
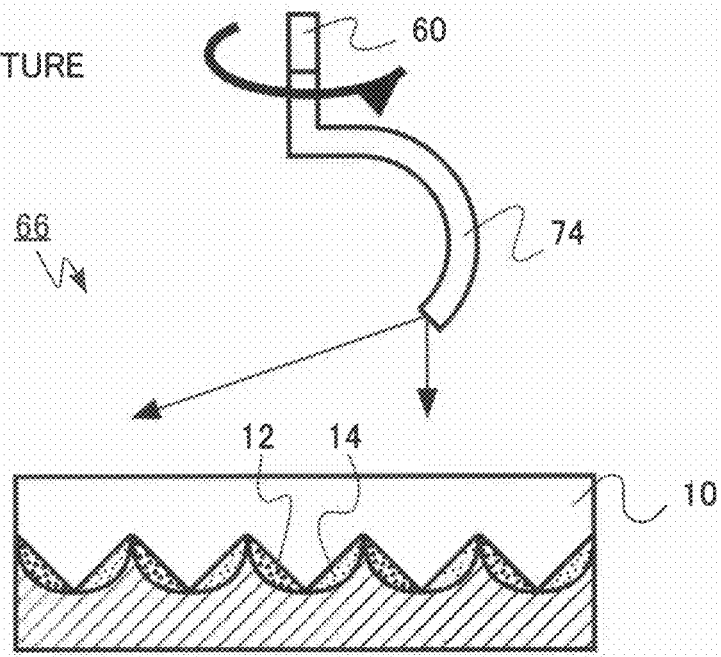
FIGS. 13A and 13B are schematic diagrams of another variant of the incident angle variable mechanism according to the second embodiment.
Figure 13B:
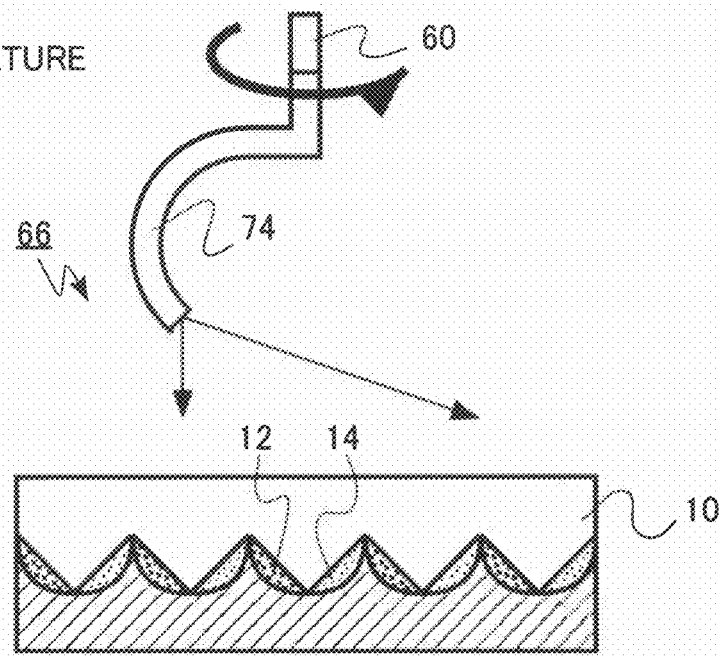

FIGS. 13A and 13B are schematic diagrams of another variant of the incident angle variable mechanism. The incident angle variable mechanism relatively moves an outgoing direction of excitation light and a substrate 10 of a light emitter 66 by rotating a curved optical fiber itself.

By placing the outgoing direction of excitation light and the substrate 10 of the light emitter 66 in a positional relationship shown in FIG. 13A, the proportion of the amount of excitation light irradiated onto first phosphor layers 12 which are blue phosphors increases, and thus, light with a high color temperature is emitted. On the other hand, by placing the outgoing direction of excitation light and the substrate 10 of the light emitter 66 in a positional relationship shown in FIG. 13B, the proportion of the amount of excitation light irradiated onto second phosphor layers 14 which are yellow phosphors increases, and thus, light with a low color temperature is emitted.

FIG. 14 is a schematic diagram of still another variant of the incident angle variable mechanism. The incident angle variable mechanism is configured such that a column 64 is fixed to the center bottom of a light emitter 66 and the light emitter 66 rotates about the column 64. By allowing excitation light from a semiconductor laser diode 60 to enter a substrate 10 of the light emitter 66 in an oblique direction, an outgoing direction of the excitation light and the substrate 10 of the light emitter 66 relatively move. By this, the color temperature of light emitted from the light emitter is made variable.

FIGS. 15A and 15B are schematic diagrams of yet another variant of the incident angle variable mechanism. In the incident angle variable mechanism, a convex lens 82 is provided between a semiconductor laser diode 60 and a light emitter 66. Furthermore, a moving mechanism (not shown) for moving an excitation light outgoing position with respect to the light emitter 66 is provided.

By setting the positional relationship between the excitation light outgoing position and the convex lens 82, as shown in FIG. 15A, the proportion of the amount of excitation light irradiated onto first phosphor layers 12 which are blue phosphors increases, and thus, light with a high color temperature is emitted. On the other hand, by setting the positional relationship between the excitation light outgoing position and the convex lens 82, as shown in FIG. 15B, the proportion of the amount of excitation light irradiated onto second phosphor layers 14 which are yellow phosphors increases, and thus, light with a low color temperature is emitted.

Third Embodiment

A display apparatus according to the present embodiment includes a light source that emits laser light; a screen that displays an image; a light valve that selectively transmits or reflects the laser light; and a projection optical system that projects the laser light coming through the light valve onto the screen at a time. The screen includes a substrate having a protrusion and recess configuration where first planes and second planes which intersect the first planes are formed periodically; first phosphor layers formed on the first planes and absorbing the laser light to emit a first fluorescence; and second phosphor layers formed on the second planes and absorbing the laser light to emit a second fluorescence with a wavelength different from that of the first fluorescence.

The display apparatus according to the present embodiment is characterized in that the screen is formed of light emitters described in the first embodiment.

Figure 16A:
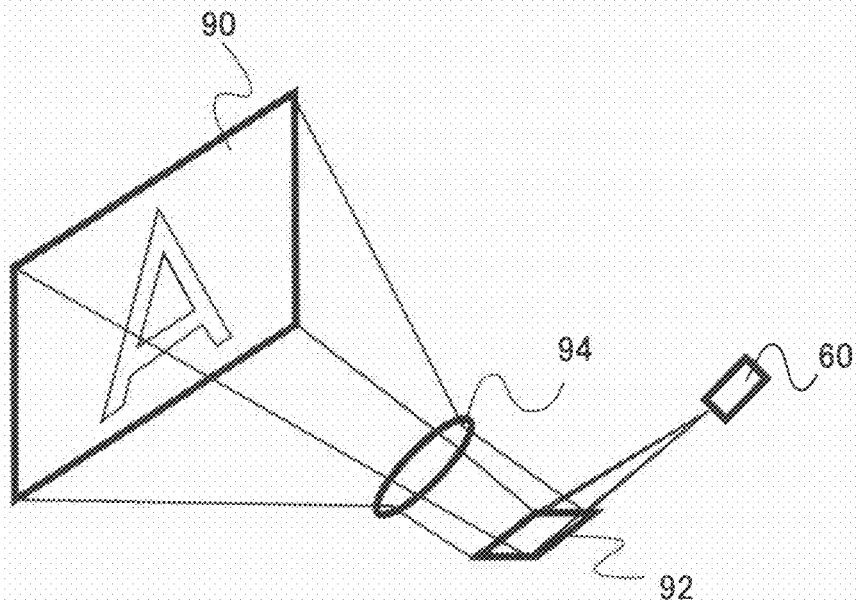
FIGS. 16A and 16B are schematic diagrams of a display apparatus according to a third embodiment.
Figure 16B:
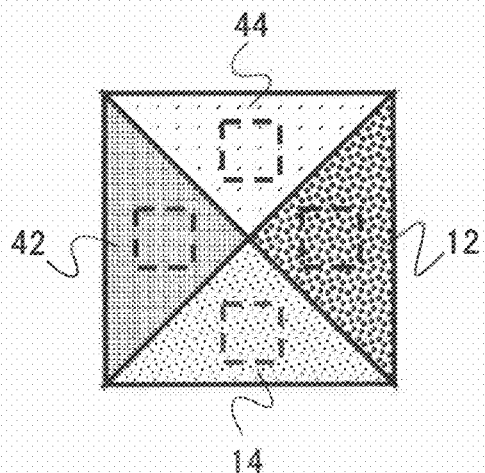

FIGS. 16A and 16B are schematic diagrams of a display apparatus according to the present embodiment. FIG. 16A is an overall view and FIG. 16B is an enlarged view of a light emitter portion of a screen.

The display apparatus according to the present embodiment includes a semiconductor laser diode 60 which is a light source; a screen 90 that displays an image; a light valve 92 that selectively transmits or reflects laser light; and a projection optical system 94 that projects the laser light coming through the light valve 92 onto the screen at a time.

The semiconductor laser diode 60 emits ultraviolet light as excitation light. As shown in FIG. 16B, the screen 90 is configured by a collection of light emitters, each having four phosphor layers in a square pyramid shape described in the first embodiment using FIGS. 8A to 8C. For example, a first phosphor layer 12 is a blue phosphor layer, a second phosphor layer 14 is a yellow phosphor layer, a third phosphor layer 42 is a green phosphor layer, and a fourth phosphor layer 44 is a red phosphor layer.

The light valve 92 has the function of selectively transmitting or reflecting laser light and thereby modulating the laser light. The light valve 92 is, for example, a DMD (Digital Micromirror Device). The projection optical system 94 is configured by combining a lens, a mirror, etc.

The laser light modulated by the light valve 92 passes through the projection optical system 94 and is projected onto the screen 90 at a time. Four phosphor layers shown in FIG. 16B function as one pixel. A region surrounded by a dashed line indicates a laser light irradiated region corresponding to one spot of the DMD. As such, by four spots of the DMD, one pixel is formed.

According to the present embodiment, since a screen where a plurality of phosphors forming one pixel are disposed so as not to overlap one another can be easily formed, a display apparatus with excellent luminous efficiency can be fabricated at low cost. In addition, fine pixels can be easily fabricated.

FIGS. 17A and 17B are schematic diagrams of a display apparatus according to a variant of the present embodiment. FIG. 17A is a side view and FIG. 17B is a top view. FIG. 18 is an illustrative diagram of the actions in the present variant. In FIGS. 16A and 16B, the display apparatus having only one set of the semiconductor laser diode 60, the light valve 92, and the projection optical system 94 is described as an example. In the present variant, the display apparatus includes four sets of semiconductor laser diodes 60a to 60d, light valves 92a to 92d, and projection optical systems 94a to 94d on top, bottom, left, and right for respective phosphor layers.

As shown in FIGS. 17A and 17B, by each of the semiconductor laser diodes 60a to 60d irradiating laser light onto corresponding phosphor layers at an optimum angle, as shown in FIG. 18, irradiation where color crosstalk is prevented can be performed. Specifically, since a screen 90 is formed of inclined surfaces, as shown in FIG. 18, for each incident direction of excitation light, phosphor layers can be disposed on surfaces that are not irradiated. Therefore, by controlling the disposition of the phosphor layers of the respective colors such that the phosphor layers are disposed on their respective appropriate inclined surfaces, color crosstalk caused by irradiation of adjacent different colors can be prevented. Accordingly, it is also possible to implement a display apparatus with higher luminance.

Fourth Embodiment

A display apparatus according to the present embodiment includes a light source that emits laser light; a screen that displays an image; an optical system that converts the laser light into parallel light; and a scanning mechanism for scanning the laser light converted into the parallel light onto the screen two-dimensionally. The screen includes a substrate having a protrusion and recess configuration where first planes and second planes which intersect the first planes are formed periodically; first phosphor layers formed on the first planes and absorbing the laser light to emit a first fluorescence; and second phosphor layers formed on the second planes and absorbing the laser light to emit a second fluorescence with a wavelength different from that of the first fluorescence.

The display apparatus according to the present embodiment is characterized in that the screen is formed of light emitters described in the first embodiment.

Figure 19A:
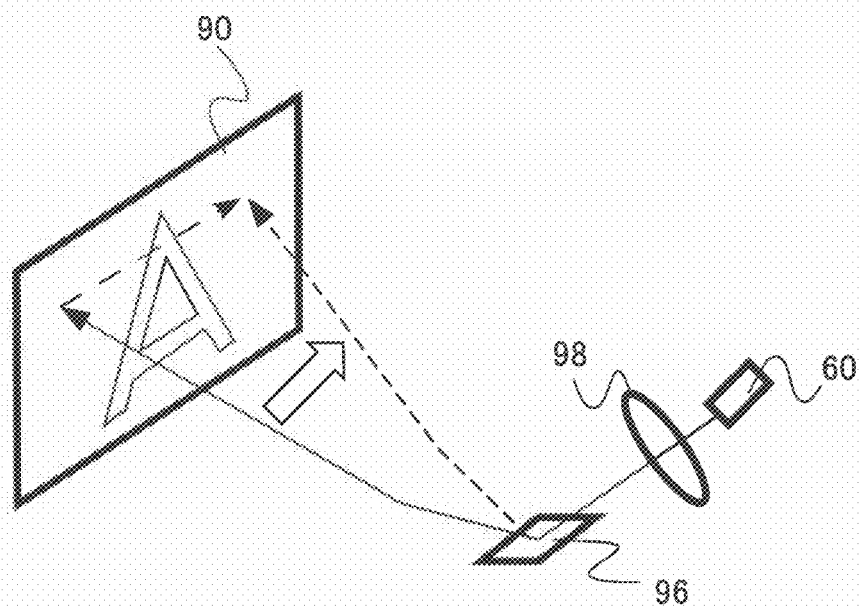
FIGS. 19A and 19B are schematic diagrams of a display apparatus according to a fourth embodiment.
Figure 19B:
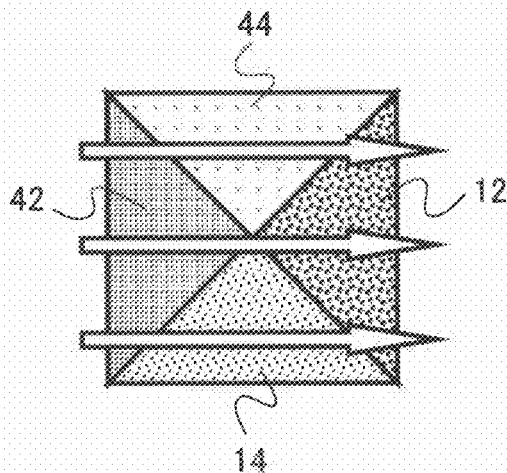

FIGS. 19A and 19B are schematic diagrams of a display apparatus according to the present embodiment. FIG. 19A is an overall view and FIG. 19B is an enlarged view of a light emitter portion of a screen.

The display apparatus according to the present embodiment includes a semiconductor laser diode 60 which is a light source; a screen 90 that displays an image; an optical system 98 that converts laser light into parallel light; and a scanning mechanism 96 for scanning the laser light converted into the parallel light onto the screen two-dimensionally.

The semiconductor laser diode 60 emits ultraviolet light as excitation light. As shown in FIG. 19B, the screen 90 is configured by a collection of light emitters, each having four phosphor layers in a square pyramid shape described in the first embodiment using FIGS. 8A to 8C. For example, a first phosphor layer 12 is a blue phosphor layer, a second phosphor layer 14 is a yellow phosphor layer, a third phosphor layer 42 is a green phosphor layer, and a fourth phosphor layer 44 is a red phosphor layer.

The scanning mechanism 96 has the function of scanning laser light two-dimensionally. The scanning mechanism 96 is, for example, a two-dimensional scanning MEMS. The optical system 98 is configured by combining a lens, a mirror, etc.

The laser light scanned by the scanning mechanism 96 is scanned onto the screen 90. For example, white arrows shown in FIG. 19B indicate scanning lines. While laser light is turned on and off, the laser light is scanned as shown by the white arrows to produce a desired color.

According to the present embodiment, since a screen where a plurality of phosphors forming a pixel are disposed so as not to overlap one another can be easily formed, a display apparatus with excellent luminous efficiency can be fabricated at low cost. Furthermore, fine pixels can be easily fabricated.

In FIGS. 19A and 19B, the display apparatus having only one set of the semiconductor laser diode 60, the scanning mechanism 96, and the optical system 98 is described as an example. However, as with the variant of the third embodiment, for example, by providing four sets of semiconductor laser diodes 60, optical systems 98, and scanning mechanisms 96 for respective phosphor layers and irradiating, by each semiconductor laser diode 60, laser light onto corresponding phosphor layers at an optimum angle, irradiation where color crosstalk is prevented can be performed. According to this configuration, it is also possible to implement a display apparatus with higher luminance.

The square pyramids in the screen 90 do not need to be disposed in a lattice manner. By disposing the square pyramids in an arc-shaped manner along the scanning lines of the scanning mechanism 96, the semiconductor laser diode 60 and the scanning mechanism 96 can be disposed to be close to the screen. In addition, by placing a reflective optical system between the scanning mechanism 96 and the screen 90 to fold an optical path, too, the disposition of the semiconductor laser diode 60 and the scanning mechanism 96 can be brought close to the screen.

While certain embodiments have been described, these embodiments have been presented by way of example only, and are not intended to limit the scope of the inventions. Indeed, light-emitting apparatuses, display apparatuses, light emitters, and methods of fabricating a light emitter described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, for materials of phosphor layers, materials that absorb light in a wavelength range from ultraviolet to blue and emit visible light are used. For example, phosphor materials can be used, including silicate-based phosphor materials, aluminate-based phosphor materials, nitride-based phosphor materials, sulfide-based phosphor materials, oxysulfide-based phosphor materials, YAG-based phosphor materials, borate-based phosphor materials, phosphate-borate-based phosphor materials, phosphate-based phosphor materials, and halophosphate-based phosphor materials. The compositions of the respective phosphor materials are shown below.

(1) Silicate-based phosphor materials: $(Sr_{(1-x-y-z)}Ba_xCa_yEu_z)_2Si_wO_{(2+2w)}$ ($0 \leq x \leq 1$, $0 \leq y \leq 1$, $0.05 \leq z \leq 0.2$, and $0.90 \leq w \leq 1.10$)

Of those silicate-based phosphor materials represented by the above-described formula, a composition with $x=0.19$, $y=0$, $z=0.05$, and $w=1.0$ is desirable. Note that to stabilize the crystal structure or to increase luminous intensity, a part of strontium (Sr), barium (Ba), and calcium (Ca) may be substituted by at least one of Mg and Zn. For silicate-based phosphor materials with other composition ratios, $MSiO_3$, $MSiO_4$, $M_2SiO_3$, $M_2SiO_5$, and $M_4Si_2O_8$ (M is at least one element selected from the group consisting of Sr, Ba, Ca, Mg, Be, Zn, and Y) can be used. Note that to control the light emission color, a part of Si may be substituted by germanium (Ge) (e.g., $(Sr_{(1-x-y-z)}Ba_xCa_yEu_z)_2(Si_{(1-u)}Ge_u)O_4$). In addition, at least one element selected from the group consisting of Ti, Pb, Mn, As, Al, Pr, Tb, and Ce may be contained as an activator.

(2) Aluminate-based phosphor materials: $M_2Al_{10}O_{17}$ (note that M is at least one element selected from the group consisting of Ba, Sr, Mg, Zn, and Ca)

As an activator, at least one of Eu and Mn is contained. For aluminate-based phosphor materials with other composition ratios, $MAl_2O_4$, $MAl_4O_{17}$, $MAl_8O_{13}$, $MAl_{12}O_{19}$, $M_2Al_{19}O_{17}$, $M_2Al_{11}O_{19}$, $M_3Al_5{}^O{}_{12}$, $M_3Al_{16}O_{27}$, and $M_4Al_5O_{12}$ (M is at least one element selected from the group consisting of Ba, Sr, Ca, Mg, Be, and Zn) can be used. In addition, at least one element selected from the group consisting of Mn, Dy, Tb, Nd, and Ce may be contained as an activator.

(3) Nitride-based phosphor materials (mainly, silicon nitride-based phosphor materials): $L_xSi_yN_{(2x/3+4y/3)}$:Eu or $L_xSi_yO_zN_{(2x/3'4y/3-2z/3)}$:Eu (L is at least one element selected from the group consisting of Sr, Ca, Sr, and Ca)

In the above-described compositions, it is desirable that x=2 and y=5 or x=1 and y=7, but x and y can take any value. For nitride-based phosphor materials represented by the above-described formulae, it is desirable to use phosphor materials such as $(Sr_xCa_{(1-x)})_2Si_5N_8$:Eu, $Sr_2Si_5N_8$:Eu, $Ca_2Si_5N_8$:Eu, $Sr_xCa_{(1-x)}Si_7N_{10}$:Eu, $SrSi_7N_{10}$:Eu, and $CaSi_7N_{10}$:Eu where Mn is added as an activator. These phosphor materials may contain at least one element selected from the group consisting of Mg, Sr, Ca, Ba, Zn, B, Al, Cu, Mn, Cr, and Ni. In addition, at least one element selected from the group consisting of Ce, Pr, Tb, Nd, and La may be contained as an activator.

(4) Sulfide-based phosphor materials: $(Zn_{(1-x)}Cd_x)S$:M (M is at least one element selected from the group consisting of Cu, Cl, Ag, Al, Fe, Cu, Ni, and Zn, and x is a numerical value satisfying $0 \leq x \leq 1$)

Note that S may be substituted by at least one of Se and Te.

(5) Oxysulfide-based phosphor materials: $(Ln_{(1-x)}Eu_x)O_2S$ (Ln is at least one element selected from the group consisting of Sc, Y, La, Gd, and Lu, and x is a numerical value satisfying $0 \leq x \leq 1$)

Note that at least one species selected from the group consisting of Tb, Pr, Mg, Ti, Nb, Ta, Ga, Sm, and Tm may be contained as an activator.

(6) YAG-based phosphor materials: $(Y_{(1-x-y-z)}Gd_xLa_ySm_z)_3(Al_{(1-v)}Ga_v)_5O_{12}$:Ce,Eu ($0 \leq x \leq 1$, $0 \leq y \leq 1$, $0 \leq z \leq 1.0 \leq v \leq 1$)

Note that at least one species, Cr or Tb, may be contained as an activator.

(7) Borate-based phosphor materials: $MBO_3$:Eu (M is at least one element selected from the group consisting of Y, La, Gd, Lu, and In)

Note that Tb may be contained as an activator. For borate-based phosphor materials with other composition ratios, $Cd_2B_2O_{55}$:Mn, $(Ce,Gd,Tb)MgB_5O_{10}$:Mn, $GdMgB_5O_{10}$:Ce,Tb, etc ., can be used.

(8) Phosphate-borate-based phosphor materials: $2(M_{(1-x)}M'_x)O \cdot aP_2O_5 \cdot bB_2O_3$ (M is at least one element selected from the group consisting of Mg, Ca, Sr, Ba, and Zn, M' is at least one element selected from the group consisting of Eu, Mn, Sn, Fe, and Cr, and x, a, and b are numerical values satisfying $0.001 \leq x \leq 0.5$, $0 \leq a \leq 2$, $0 \leq b \leq 3$, and $0.3 < (a+b)$)

(9) Phosphate-based phosphor materials: $(Sr_{(1-x)}Ba_x)_3(PO_4)_2$:Eu or $(Sr_{(1-x)}Ba_x)_2P_2O_7$:Eu,Sn Note that either one of Ti and Cu may be contained as an activator.

(10) Halophosphate-based phosphor materials: $(M_{(1-x)}Eu_x)_{10}(PO_4)_6Cl_2$ or $(M_{(1-x)}Eu_x)_5(PO_4)_3Cl$ (M is at least one element selected from the group consisting of Ba, Sr, Ca, Mg, and Cd, and x is a numerical value satisfying $0 \leq x \leq 1$)

Note that at least a part of Cl may be substituted by fluorine (F). In addition, at least one of Sb and Mn may be contained as an activator.

What is claimed is:
1. A light-emitting apparatus comprising:
   a light source emitting excitation light;
   a substrate having a protrusion and recess configuration, the configuration constructed by periodically formed first planes and second planes intersecting the first planes;
   first phosphor layers formed on the first planes, the first phosphor layers absorbing the excitation light to emit a first fluorescence; and
   second phosphor layers formed on the second planes, the second phosphor layers absorbing the excitation light to emit a second fluorescence with a wavelength different from that of the first fluorescence; and a metal layer formed on the first phosphor layers and the second phosphor layers.
2. The apparatus according to claim 1, further comprising an incident angle variable mechanism configured to make incident angles of the excitation light on the first and second planes variable.
3. The apparatus according to claim 1, wherein:
   the substrate is formed of a transparent glass, the excitation light enters to the first and second phosphor layers from the substrate side, and the first and second fluorescences are extracted through the substrate.
4. The apparatus according to claim 1, wherein an angle formed by a first plane and a second plane is 90 degrees or less.
5. The apparatus according to claim 1, wherein:
   when luminous efficiency of the first phosphor layers is higher than that of the second phosphor layers, a total area of the first planes is made smaller than that of the second planes, and
   when the luminous efficiency of the first phosphor layers is lower than that of the second phosphor layers, the total area of the first planes is made larger than that of the second planes.
6. The apparatus according to claim 1, further comprising third planes and fourth planes, wherein:
   the first planes, the second planes, the third planes, and a fourth planes form square pyramids, and third phosphor layers are formed on the third planes and fourth phosphor layers are formed on the fourth planes.
7. The apparatus according to claim 1, wherein the light source is a semiconductor laser diode.
8. A display apparatus comprising:
   a light source emitting laser light;
   a screen displaying an image;
   a light valve selectively transmitting or reflecting the laser light; and
   a projection optical system projecting the laser light coming through the light valve onto the screen at a time, wherein
   the screen includes a substrate having a protrusion and recess configuration, the configuration constructed by periodically formed first planes and second planes intersecting the first planes; first phosphor layers formed on the first planes absorbing the laser light to emit a first fluorescence; and second phosphor layers formed on the second planes absorbing the laser light to emit a second fluorescence with a wavelength different from that of the first fluorescence; and a metal layer formed on the first phosphor layers and the second phosphor layers.

9. A display apparatus comprising:

a light source emitting laser light;

a screen displaying an image;

an optical system configured to convert the laser light into parallel light; and a scanning mechanism configured to scan the parallel light onto the screen two-dimensionally, wherein:

the screen includes a substrate having a protrusion and recess configuration, the configuration constructed by periodically formed first planes and second planes intersecting the first planes; first phosphor layers formed on the first planes absorbing the laser light to emit a first fluorescence; and second phosphor layers formed on the second planes absorbing the laser light to emit a second fluorescence with a wavelength different from that of the first fluorescence; and a metal layer formed on the first phosphor layers and the second phosphor layers.

10. A light emitter comprising:

a transparent substrate having a protrusion and recess configuration, the configuration constructed by periodically formed first planes and second planes intersecting the first planes;

first phosphor layers formed on the first planes;

second phosphor layers formed on the second planes emitting fluorescence with a wavelength different from that of fluorescence emitted from the first phosphor layers; and a metal layer formed on the first phosphor layers and second phosphor layers, wherein the first planes and second planes are made of same material, each of the first planes has same inclination angle, each of the second planes has same inclination angle and the first planes and second planes are alternately repeated.

* * * * *